(12) United States Patent
Watanabe et al.

(10) Patent No.: US 7,655,743 B2
(45) Date of Patent: Feb. 2, 2010

(54) PROCESS FOR PRODUCING PHOTORESIST POLYMERIC COMPOUNDS

(75) Inventors: Hitoshi Watanabe, Himeji (JP);
Hidetaka Hayamizu, Himeji (JP);
Masaaki Kishimura, Kakogawa (JP)

(73) Assignee: Daicel Chemical Industries, Ltd., Osaka (JP)

( * ) Notice: Subject to any disclaimer, the term of this patent is extended or adjusted under 35 U.S.C. 154(b) by 0 days.

(21) Appl. No.: 12/146,594

(22) Filed: Jun. 26, 2008

(65) Prior Publication Data

US 2008/0268377 A1 Oct. 30, 2008

Related U.S. Application Data

(62) Division of application No. 11/335,589, filed on Jan. 20, 2006, now abandoned, which is a division of application No. 10/476,211, filed as application No. PCT/JP03/03058 on Mar. 14, 2003, now Pat. No. 7,015,291.

(30) Foreign Application Priority Data

Apr. 1, 2002 (JP) ............... 2002-098840
Apr. 1, 2002 (JP) ............... 2002-098841

(51) Int. Cl.
*C08F 124/00* (2006.01)
(52) U.S. Cl. .................. 526/268; 526/270; 526/281; 526/328.5; 430/270.1
(58) Field of Classification Search ............... 526/268, 526/270, 281, 328.5; 430/270.1
See application file for complete search history.

(56) References Cited

U.S. PATENT DOCUMENTS

| | | | |
|---|---|---|---|
| 5,080,997 A | 1/1992 | Hioki et al. | |
| 5,284,930 A | 2/1994 | Matsumoto et al. | |
| 5,378,802 A | 1/1995 | Honda | |
| 5,446,125 A | 8/1995 | Honda et al. | |
| 5,665,517 A | 9/1997 | Rahman et al. | |
| 5,693,749 A | 12/1997 | Rahman et al. | |
| 5,939,511 A | 8/1999 | Zampini et al. | |
| 6,239,231 B1 | 5/2001 | Fujishima et al. | |
| 6,277,546 B1 | 8/2001 | Breyta et al. | |
| 6,280,898 B1 | 8/2001 | Hasegawa et al. | |
| 6,462,158 B1 | 10/2002 | Miwa et al. | |
| 6,479,211 B1 | 11/2002 | Sato et al. | |
| 6,492,091 B2 | 12/2002 | Kodama et al. | |
| 6,579,659 B2 * | 6/2003 | Uetani et al. | 430/270.1 |
| 6,706,826 B1 | 3/2004 | Fujiwara et al. | |
| 7,070,914 B2 * | 7/2006 | Neisser et al. | 430/322 |
| 7,108,951 B2 | 9/2006 | Sasaki et al. | |
| 2001/0026901 A1 | 10/2001 | Maeda et al. | |
| 2002/0098441 A1 | 7/2002 | Okino et al. | |
| 2003/0013039 A1 | 1/2003 | Kobayashi et al. | |

FOREIGN PATENT DOCUMENTS

| | | |
|---|---|---|
| EP | 1 122 607 A1 | 8/2001 |
| EP | 1 172 384 A1 | 1/2002 |
| EP | 1 172 694 A1 | 1/2002 |
| JP | 2-154259 A | 6/1990 |
| JP | 5234878 A2 | 9/1993 |
| JP | 11-512833 A | 11/1999 |
| JP | 2000-26446 A | 1/2000 |
| JP | 2000-122294 A | 4/2000 |
| JP | 2000-137327 A | 5/2000 |
| JP | 2000-159758 A | 6/2000 |
| JP | 2000-338674 A | 12/2000 |
| JP | 2001-62312 A | 3/2001 |
| JP | 2001-64325 A | 3/2001 |
| JP | 2001-109154 A | 4/2001 |
| JP | 2001-142212 A2 | 5/2001 |
| JP | 2001-240625 A | 9/2001 |
| JP | 2001-242627 A | 9/2001 |
| JP | 2001-247513 A | 9/2001 |
| JP | 2002-23371 A | 1/2002 |
| WO | WO-99/50322 A1 | 10/1999 |
| WO | WO-00/01684 A1 | 1/2000 |

* cited by examiner

*Primary Examiner*—Helen L. Pezzuto
(74) *Attorney, Agent, or Firm*—Birch, Stewart, Kolasch & Birch, LLP

(57) ABSTRACT

Process for producing photoresist polymeric compound having repeated units corresponding to at least one monomer selected from monomer (a) having lactone skeleton, monomer (b) having group which becomes soluble in alkali by elimination with acid, and monomer (c) having alicyclic skeleton having hydroxyl group. Process includes (A) polymerizing mixture of monomers containing at least one monomer selected from the above monomers (a), (b), and (c), and (B) extracting polymer formed in the polymerization by using organic solvent and water to partition the formed polymer into organic solvent layer and metal component impurity into aqueous layer, or passing polymer solution, which contains polymer having repeated units corresponding to at least one of the above monomers (a), (b), and (c) and metal content of which is 1000 ppb by weight or less relative to the polymer through filter comprising porous polyolefin membrane having cation-exchange group. The photoresist polymeric compounds have a metallic impurity content that is extremely low.

8 Claims, No Drawings

PROCESS FOR PRODUCING PHOTORESIST POLYMERIC COMPOUNDS

CROSS-REFERENCE TO RELATED APPLICATIONS

The present application is a Divisional of U.S. application Ser. No. 11/335,589 filed on Jan. 20, 2006, now abandoned which is a Divisional of U.S. application Ser. No. 10/476,211 filed on Oct. 28, 2003, now U.S. pat. No. 7,015,291 which is the National Phase of PCT Application No. PCT/JP03/03058 filed on Mar. 14, 2003, which in turn claims priority of Japanese Application Nos. 2002-098840 and 2002-098841, both of which were filed on Apr. 1, 2002. The entire contents of each of the above-identified applications is hereby incorporated by reference.

TECHNICAL FIELD

The present invention relates to a process for producing a photoresist polymeric compound that is useful to prepare a photoresist-resin composition applied for a micro processing of semiconductor and others.

BACKGROUND ART

Positive photoresist used in a process for producing semiconductors must concurrently have different characteristics such as a property that an exposed portions becomes soluble in alkali by light irradiation, an ability of adhesion to silicon wafers, plasma-etching resistance, and transparency to used light. The positive photoresist is generally used as a solution containing a base component polymer, a light-activatable acid generator, and some sorts of additives for controlling the above characteristics. On the other hand, a wavelength of a light source of lithography used for manufacturing semiconductors has become shorter from year to year and the ArF excimer laser with a wavelength of 193 nm is promising as a next-generation light source. As a photoresist polymer used in the ArF excimer laser exposure system, various polymers having repeated units containing a lactone skeleton that exhibit high adhesion to substrates and an alicyclic hydrocarbon skeleton that exhibits high etching resistance have been proposed.

These polymers are ordinarily isolated by polymerizing a mixture of monomers, and subjecting the polymer solution to be allowed to precipitation procedure. There is, however, a problem that a required capability (sensitivity and others) isn't performed because of containing an impurity such as metal component in the resulting polymer when the polymer is used as a photoresist resin component. Particularly, when metal components such as sodium and iron are contained, an electrical characteristic of semiconductors declines. There is also a problem that a polymer is hard to be dissolved in a resist solvent because surface of the polymer particles become hard or the polymer particles are welded to each other.

DISCLOSURE OF INVENTION

Accordingly, an object of the present invention is to provide a process for effectively producing a photoresist polymeric compound in which a content of impurities such as a metal component or others is extremely low.

Another object of the present invention is to provide a process for effectively producing a photoresist polymeric compound, which is easily and certainly dissolved in a resist solvent in addition to the above point.

Still another object of the present invention is to provide a process for producing a photoresist polymeric compound, which don't exert a bad influence upon an electrical characteristic of semiconductor and so on in case of using as a resin component in a photoresist resin compound.

The present inventors made intensive investigations to achieve the above objects, and found that, when a photoresist polymer is treated by extraction procedure using an organic solvent and water, or a polymer solution containing a photoresist polymer and being metal content of a specific amount or less is passed through a filter constituted by a specific porous polyolefin membrane, metal components, which exert a bad influence upon a resist performance and an electrical characteristic of semiconductor can be removed easily. The present invention was completed based on the above information.

Specifically, the present invention is to provide a process for producing a photoresist polymeric compound, which have a repeated unit corresponding to at least one monomer selected from a monomer (a) having a lactone skeleton, a monomer (b) having a group, which becomes soluble in alkali by elimination with an acid and a monomer (c) having an alicyclic skeleton having a hydroxyl group, which process comprises the step of;

(i) the polymerization step (A) of subjecting a mixture of monomers containing at least one monomer selected from the above monomers (a), (b) and (c) to polymerization, and the extraction step (B) of subjecting the polymer formed in the polymerization to extraction procedure using an organic solvent and water to partition the formed polymer into an organic solvent layer and a metal component as an impurity into an aqueous layer, or (ii) the step (I) of passing a polymer solution, which contains a polymer having a repeated unit corresponding to at least one of the above monomers (a), (b) and (c), and a metal content of which is 1000 ppb by weight or less relative to the polymer, through a filter constituted by a porous polyolefin membrane having cation-exchange group.

The monomer (a) having a lactone skeleton includes (meth) acrylic acid ester monomers represented by the following formulae (1a), (1b) and (1c):

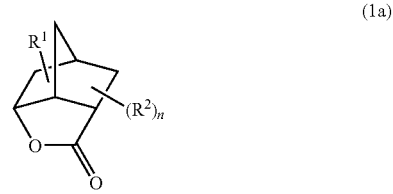

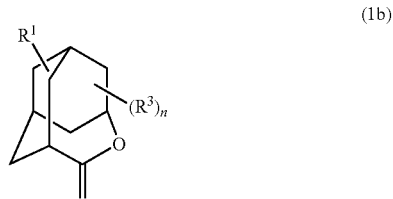

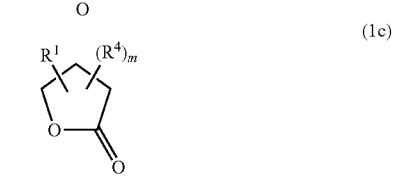

wherein $R^1$ is a group including (meth)acryloyloxy group, each of $R^2$, $R^3$ and $R^4$ is a lower alkyl group, n denotes an integer of 0 to 3, and m denotes an integer of 0 to 5.

The monomer (b) having a group which becomes soluble in alkali by elimination with an acid includes (meth) acrylic acid ester monomers represented by the following formulae (2a) and (2b):

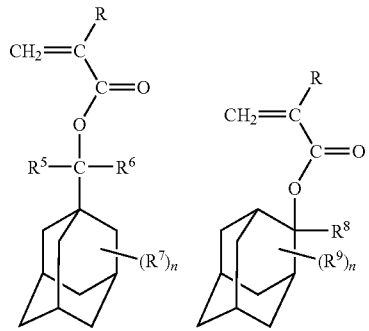

wherein R is a hydrogen atom or a methyl group, $R^5$ is a hydrogen atom or a lower alkyl group, each of $R^6$, $R^7$, $R^8$ and $R^9$ is a lower alkyl group, and n denotes an integer of 0 to 3.

The monomer (c) having an alicyclic skeleton having a hydroxyl group includes (meth)acrylic acid ester monomers represented by the following formula (3a):

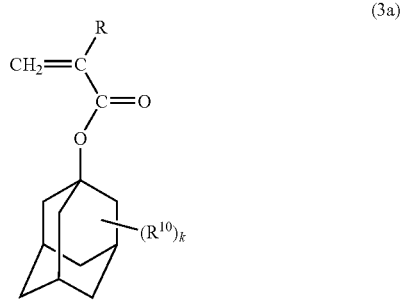

(3a)

wherein R is a hydrogen atom or a methyl group, $R^{10}$ is a methyl group, a hydroxyl group, an oxo group or a carboxyl group and k denotes an integer of 1 to 3, where at least one of the k $R^{10}$s is a hydroxyl group.

The polymerization step (A) may comprise the step of polymerizing a mixture of monomers in a glycol or ester solvent by dropping polymerization method.

The extraction step (B) may comprise the step of adding an organic solvent having a specific gravity of 0.95 or less and water into a polymerization solution obtained in a polymerization step (A) to partition a formed polymer into an organic solvent layer and a metal component as an impurity into an aqueous layer. Further, the extraction step (B) may comprise the step of extracting by adding an organic solvent having a specific gravity of 0.95 or less and a solubility parameter (SP value) of 20 $MPa^{1/2}$ or less and water in a glycol or ester solvent solution of a polymer formed by polymerization, and to partition the formed polymer into an organic solvent layer and a metal component as an impurity into a aqueous layer.

The process of the present invention may further comprise a precipitation purification step (C) of precipitating or re-precipitating a polymer formed by polymerization. The precipitation purification step (C) may comprise the step of precipitating or re-precipitating a polymer by adding a solution containing a polymer formed by polymerization and glycol or ester solvent into a solvent containing at least a hydrocarbon.

The process of the present invention may comprise the repulping step (D) of repulping a polymer formed by polymerization with a solvent. A hydrocarbon solvent can be used as a repulping solvent.

The process of the present invention may comprise the rinsing step (E) of rinsing a polymer formed by polymerization with a solvent. A hydrocarbon solvent and/or water such as super-pure water can be used as a rinsing solvent.

The process of the present invention may comprise the drying step (F) of drying the resulting polymer (the recovered precipitate) after the polymer formed by polymerization is subjected to precipitation purification. Further, the process of the present invention may comprise the redissolving step (G) of redissolving the resulting polymer (the recovered precipitate) in an organic solvent to prepare a polymer solution after the polymer formed by polymerization is subjected to precipitation purification. At least one solvent selected from a glycol solvent, an ester solvent and a ketone solvent can be used as a redissolving solvent. In addition, the process of the present invention may comprise the evaporating step (H) wherein a photoresist-polymer solution is prepared by concentrating a polymer solution obtained by redissolving in an organic solvent to remove a low-boiling-point solvent.

The process of the present invention may comprise the filtration step (J) wherein insolubles are removed by filtrating a polymer solution containing a polymer having a repeated unit corresponding to at least one monomer selected from the monomers (a), (b) and (c) before the step (I).

The process of the present invention may comprise the water washing treatment step (K) wherein a metal content in a polymer solution is reduced by washing a polymer solution containing a polymer having a repeated unit corresponding to at least one monomer selected from the monomers (a), (b) and (c) with water before the step (I).

In the present description, the term "metal content" means a total content (as metal) of Na, Mg, Al, K, Ca, Cr, Mn, Fe, Ni, Cu and Zn on the basis of a polymer.

BEST MODE FOR CARRYING OUT THE INVENTION

[Polymerization Step (A)]

In the polymerization step (A), a mixture of monomers (even when a monomer is single sort, "a mixture of monomers" is used for the sake of convenience) containing at least one monomer selected from a monomer (a) having a lactone skeleton, a monomer (b) containing a group which becomes soluble in alkali by elimination with an acid and a monomer (c) having an alicyclic skeleton containing a hydroxyl group is treated in a polymerization to form a polymer.

The monomer (a) having a lactone skeleton gives substrate-adhesive function to a polymer. Further, depending on a structure, an acid-cleavage function (alkali-soluble function) may be given to a polymer (a repeated unit having β-(meth)acryloyloxy-γ-butyrolactone and so on). A lactone skeleton isn't limited particularly and, for example, about 4 to 20 membered lactone skeleton is represented. A lactone skeleton may be a single ring of only a lactone ring and may be a polycyclic ring made by condensation of a non-aromatic or aromatic carbon ring or hetero ring. Typical lactone skeletons are 3-oxatricyclo[4.2.1.0$^{4,8}$]nonane-2-one ring (=2-oxatricyclo[4.2.1.0$^{4,8}$]nonane-3-one ring), 3-oxatricyclo[4.3.1.1$^{4,8}$]undecane-2-one ring, γ-butyrolactone ring, δ-valerolactone ring, ε-caprolactone and so on. In many case, a lactone skeleton combines with a carbon atom constituting a backbone of polymer through an ester bond or an ester bond and a connecting group such an alkylene group.

Typical examples of the monomer (a) having a lactone skeleton are (meth)acrylic acid ester monomers represented by the above formulae (1a), (1b) and (1c). Wherein each of $R^1, R^2, R^3$ and $R^4$ is a group bonding to a ring and $R^1$ is a group having (meth)acryloyloxy group, each of $R^2$, $R^3$ and $R^4$ is a lower alkyl group, n denotes an integer of 0 to 3 and m denotes an integer of 0 to 5. The group having the said (meth)acryloyloxy group includes, for example, (meth)acryloyloxy group; (meth)acryloyloxy alkyl group such as (meth)acryloyloxy methyl group and (meth)acryloyloxy ethyl group. In many case, $R^1$ bonds to the 5th position of 3-oxatricyclo[4.3.1.0$^{4,8}$]nonane-2-one ring in the formula (1a), to the 6th position of 3-oxatricyclo[4.2.1.1$^{4,8}$]undecane-2-one ring in the formula (1b) and to the α position or the β position of γ-butyrolactone ring in the formula (1c).

The lower alkyl groups in $R^2$, $R^3$ and $R^4$ include, for example, $C_{1-4}$ alkyl groups such as methyl, ethyl, isopropyl, propyl, butyl, isobutyl, s-butyl and t-butyl group. The preferable lower alkyl group includes methyl group and ethyl group, and methyl group is particularly preferable.

In the (meth)acrylic acid ester represented by the above formula (1a), the n $R^2$s may be the same group or different from each other. In many case, $R^2$ bonds to a carbon atom of a bridge head position.

As the typical examples of the (meth)acrylic acid ester monomer represented by the formula (1a), there may be mentioned 5-acryloyloxy-3-oxatricyclo[4.2.1.0$^{4,8}$]nonane-2-one (=9-acryloyloxy-2-oxatricyclo[4.2.1.0$^{4,8}$]nonane-3-one =5-acryloyloxy-2,6-norbornane carbolactone), 5-methacryloyloxy-3-oxatricyclo[4.2.1.0$^{4,8}$]nonane-2-one (=9-methacryloyloxy-2-oxatricyclo[4.2.1.0$^{4,8}$]nonane-3-one=5-methacryloyloxy-2,6-norbornane carbolactone) and so on.

In the (meth) acrylic acid ester monomer represented by the above formula (1b), the n $R^3$s may be the same group or different from each other. In many case, $R^3$ bonds to a carbon atom of a bridge head position.

As the typical examples of the (meth)acrylic acid ester monomer represented by the formula (1b), there may be mentioned 6-acryloyloxy-3-oxatricyclo[4.3.1.1$^{4,8}$]undecane-2-one, 6-methacryloyloxy-3-oxatricyclo[4.3.1.1$^{4,8}$]undecane-2-one and so on.

In the (meth)acrylic acid ester monomer represented by the above formula (1c), the m $R^4$s may be the same group or different from each other. Preferably, m is about 0 to 3.

As the typical examples of the (meth)acrylic acid ester monomer represented by the formula (1c), there may be mentioned, for example, α-(meth)acryloyloxy-γ-butyrolactones such as α-acryloyloxy-γ-butyrolactone, α-acryloyloxy-α-methyl-γ-butyrolactone, α-acryloyloxy-β,β-dimethyl-γ-butyrolactone, α-acryloyloxy-α, β,β-trimethyl-γ-butyrolactone, α-acryloyloxy-γ,γ-dimethyl-γ-butyrolactone, α-acryloyloxy-α,γ,γ-trimethyl-γ-butyrolactone, α-acryloyloxy-β,β,γ,γ-tetramethyl-γ-butyrolactone, α-acryloyloxy-α,β,β,γ,γ-pentamethyl-γ-butyrolactone, α-methacryloyloxy-γ-butyrolactone, α-methacryloyloxy-α-methyl-γ-butyrolactone, α-methacryloyloxy-β,β-dimethyl-γ-butyrolactone, α-methacryloyloxy-α,β,β-trimethyl-γ-butyrolactone, α-methacryloyloxy-γ,γ-dimethyl-γ-butyrolactone, α-methacryloyloxy-α,γ,γ-trimethyl-γ-butyrolactone, α-methacryloyloxy-β,β,γ,γ-tetramethyl-γ-butyrolactone and α-methacryloyloxy-α,β,β,γ,γ-pentamethyl-γ-butyrolactone; a β-(meth)acryloyloxy-γ-butyrolactones such as β-acryloyloxy-γ-butyrolactone and β-methacryloyloxy-γ-butyrolactone.

The compounds represented by the above formulae (1a), (1b) and (1c) can be obtained by subjecting a corresponding alcohol compounds and (meth)acrylic acid or its reactive derivative to a conventional esterification reaction.

The monomer (b) containing a group, which becomes soluble in alkali by elimination with an acid, gives a polymer an alkali-soluble function. As typical examples of the monomer (b) having a group which becomes soluble in alkali by elimination with an acid, there may be mentioned (meth) acrylic acid ester monomers represented by the above formulae (2a) or (2b). In the formulae, R is a hydrogen atom or a methyl group, $R^5$ is a hydrogen atom or a lower alkyl group, each of $R^6$, $R^7$, $R^8$ and $R^9$ is a lower alkyl group and n denotes an integer of 0 to 3. Each of $R^7$ and $R^9$ is a group bonding to a ring. As the lower alkyl group, there may be mentioned the same groups as defined above.

In the (meth) acrylic acid ester monomers represented by the above formula (2a), the n $R^7$s may be the same group or different from each other. In many case, $R^7$ bonds to a carbon atom of a bridge head position.

As the typical examples of the (meth)acrylic acid ester monomers represented by the formula (2a), there may be mentioned, for example, 1-(1-acryloyloxy-1-methylethyl)adamantane, 1-(1-acryloyloxy-1-methylethyl)-3,5-dimethyladamantane, 1-(1-methacryloyloxy-1-methylethyl)adamantane, 1-(1-methacryloyloxy-1-methylethyl)-3,5-dimethyladamantane and others.

In the (meth)acrylic acid ester monomers represented by the above formula (2b), the n $R^9$s may be the same group or different from each other. In many case, $R^9$ bonds to a carbon atom of a bridge head position.

As the typical examples of the (meth)acrylic acid ester monomers represented by the formula (2b), there may be mentioned, for example, 2-acryloyloxy-2-methyladamantane, 2-acryloyloxy-2,5,7-trimethyladamantane, 2-methacryloyloxy-2-methyladamantane, 2-methacryloyloxy-2,5,7-trimethyladamantane and others.

The monomer (c) including an alicyclic skeleton having a hydroxyl group gives a polymer an etching resistance and substrate-adhesive function. The alicyclic hydrocarbon group may be a single-ring hydrocarbon group or a multi-ring (bridged-ring) hydrocarbon group. As the typical examples of the monomer (c) including an alicyclic skeleton having a hydroxyl group, there may be mentioned the (meth)acrylic ester monomers represented by the formula (3a). In the formula, R is a hydrogen atom or a methyl group; $R^{10}$ is a substituent bonding to a ring and shows a methyl group, a hydroxyl group, an oxo group or a carboxyl group. k denotes an integer of 1 to 3. The k $R^{10}$s may be the same group or different from each other. At least one of the k $R^{10}$s is a hydroxyl group. In many case, $R^{10}$ bonds to a carbon atom of a bridge head position.

As the typical examples of the (meth)acrylic acid ester monomers represented by the formula (3a), there may be mentioned, for example, 1-acryloyloxy-3-hydroxy-5,7-dimethyladamantane, 1-hydroxy-3-methacryloyloxy-5,7-dimethyladamantane, 1-acryloyloxy-3-hydroxyadamantane, 1-hydroxy-3-methacryloyloxyadamantane, 1-acryloyloxy-3,5-dihydroxyadamantane, 1,3-dihydroxy-5-methacryloyloxyadamantane and others.

As a monomer employed in a polymerization, at least one of the above monomers (a), (b) and (c), preferably two or more of the above three sorts, and particularly three sorts of monomers may be used. Further, if necessary, other monomer may be subjected to co-polymerization. Polymerization may be performed by common methods such as a solution polymerization and a bulk polymerization.

For a polymerization solvent, solvents employed commonly in a polymerization of an acrylic monomer or an olefin monomer may be suitable and there may be mentioned, for example, a glycol solvent, an ester solvent, a ketone solvent, an ether solvent or a mixed solvent thereof. The glycol solvent includes, for example, propylene glycols solvent such as propylene glycol monomethyl ether, propylene glycol monomethyl ether acetate; ethylene glycols solvent such as ethylene glycol monomethyl ether, ethylene glycol monomethyl ether acetate, ethylene glycol monoethyl ether, ethylene glycol monoethyl ether acetate, ethylene glycol monobutyl ether, ethylene glycol monobutyl ether acetate; and so on. As the ester solvent, there may be mentioned lactic acid esters solvent such as ethyl lactate; propionic acid esters solvent such as methyl 3-methoxypropionionate; acetic acid esters solvent such as methyl acetate, ethyl acetate, propyl acetate and butyl acetate; and so on. The ketone solvent includes acetone, methyl ethyl ketone, methyl isobutyl ketone, methyl amyl ketone, cyclohexanone and others. The ether solvent includes diethyl ether, diisopropyl ether, dibutyl ether, tetrahydrofuran, dioxane and others.

A preferable polymerization solvent includes glycols solvent such as propylene glycol monomethyl ether and propylene glycol monomethyl ether acetate, ester solvents such as ethyl lactate, ketones solvent such as methyl isobutyl ketone and methyl amyl ketone, and a mixed solvent thereof. Particularly, solvents containing at least propylene glycol monomethyl ether acetate such as a single solvent of propylene glycol monomethyl ether acetate, a mixed solvent of propylene glycol monomethyl ether acetate and propylene glycol monomethyl ether, and a mixed solvent of propylene glycol monomethyl ether acetate and ethyl lactate are preferred.

As a polymerization method, dropping polymerization is suitably employed. The dropping polymerization is the method performing a polymerization by dropping or adding a monomer (solution) and/or a polymerization initiator (solution) successively into a reactor. The dropping polymerization provides a polymer having uniform co-polymerization composition obtained at the first stage of polymerization with that obtained at the latter stage thereof. A known polymerization initiator can be used. A polymerization temperature is, for example, from 40° C. to 150° C. and preferably from about 60° C. to 120° C.

An obtained polymerization solution (polymer dope) may be treated in the filtration step to remove impurities. A pore size of a filtration material used in a filtration is, for example, 1 μm or less and preferably 0.8 μm or less.

[Extraction Step (B)]

In the extraction step (B), a polymer formed by polymerization is treated in an extraction procedure (washing procedure) using an organic solvent and water, and the formed polymer is partitioned into an organic solvent layer and a metal element as impurities is partitioned into an aqueous layer. By this step, a metal element badly affecting to a resist performance can be effectively removed from a polymer. A treated material treated in the extraction step (B) can be a polymer formed by polymerization or a solution containing the polymer, and the solution may be either a polymer solution at the end of polymerization (polymer dope) or a solution obtained by appropriate treatment such as dilution, concentration, filtration and washing of the polymer solution. An organic solvent is effective if it is the solvent, which can dissolve a polymer and separate from water. Further, the amount of used organic solvent and water can be appropriately selected in a range of which an organic solvent layer can separate from an aqueous layer.

As a preferable condition, a polymer solution obtained in the polymerization step (A) is subjected to extraction (wash) by adding an organic solvent having a density of 0.95 or less (particularly an organic solvent having a solubility parameter (SP value) of 20 $MPa^{1/2}$ or less) and water. Further, it is also preferable that a glycol or ester solvent solution of a polymer formed by polymerization is subjected to extraction (wash) by adding an organic solvent having a density of 0.95 or less and a solubility parameter (SP value) of 20 $MPa^{1/2}$ or less and water. As density of organic solvent, a value in 20° C. to 25° C. can be employed. A SP value of organic solvent can be calculated by, for example, a method represented in "Polymer Handbook" fourth edition, VII page 675 to VII page 711 (particularly, the equation (B3) and the equation (B8) in page 676). Further, as SP value of organic solvent, the values in the table 1 (VII page 683) and the table 7 to table 8 (VII page 688 to VII page 711) of the said literature can be employed.

A glycol or ester solvent solution of a polymer formed by polymerization may be either a polymer solution at the end of polymerization (polymer dope) or a solution obtained by treating the polymer solution with appropriate treatment such as dilution, concentration, filtration and washing. As a glycol solvent and an ester solvent, there may be mentioned solvents described above.

A density of glycols solvent such as propylene glycol monomethyl ether acetate and esters solvent such as ethyl lactate is close to that of water (close to 1), so that it is difficult to separate them from water. However by adding an organic solvent having a density of 0.95 or less and a SP value of 20 $MPa^{1/2}$ or less (for example, 13 to 20 $MPa^{1/2}$) into the glycol or ester solvent, it becomes extremely easy to separate an organic layer from water. When a density of an added organic solvent is over 0.95, a difference of density toward water is less, thereby a good performance of separation is difficult to obtain. Further, when a SP value of an added organic solvent is over 20 $MPa^{1/2}$, solubility in water is increased, thereby a good performance of separation is also difficult to obtain. A density of added organic solvent is preferably from 0.6 to 0.95, more preferably from 0.7 to 0.85 (particularly, from 0.7 to 0.82). A SP value of added organic solvent is preferably from 16 to 19 $MPa^{1/2}$, more preferably from 16.5 to 18.5 $MPa^{1/2}$ (particularly, from 16.5 to 18 $MPa^{1/2}$).

As typical examples of an organic solvent having a density of 0.95 or less and a SP value of 20 $MPa^{1/2}$ or less, there may be mentioned, for example, aliphatic hydrocarbons such as hexane (density 0.659; SP value 14.9), octane (density 0.703; SP value 15.6) and dodecane (density 0.749; SP value 16.2); alicyclic hydrocarbons such as cyclohexane (density 0.779; SP value 16.8); aromatic hydrocarbons such as ethylbenzene (density 0.862; SP value 18.0), p-xylene (density 0.857; SP value 18.0), toluene (density 0.867; SP value 18.2), and benzene (density 0.874; SP value 18.8); ethers such as diisopropyl ether (density 0.726; SP value 14.1); ketones such as diisobutyl ketone (density 0.806; SP value 16.0), methyl isobutyl ketone (density 0.796; SP value 17.2), methyl propyl ketone (density 0.809; SP value 17.8), methyl isopropyl ketone (density 0.803; SP value 17.4), methyl ethyl ketone (density 0.805; SP value 19.0) and methyl amyl ketone (density 0.815; SP value 17.6); esters such as isopropyl acetate (density 0.872; SP value 17.2), butyl acetate (density 0.881; SP value 17.4) and propyl acetate (density 0.889; SP value 18.0). The density in the above parentheses is a value at 20° C.

(provided that it is a value at 25° C. for benzene, p-xylene, ethylbenzene and methyl isobutyl ketone) and a unit of SP value is $MPa^{1/2}$.

In these solvents, ketones such as diisobutyl ketone, methyl isobutyl ketone, methyl propyl ketone, methyl isopropyl ketone and methyl amyl ketone.

The amount of used organic solvent having a density of 0.95 or less and a SP value of 20 $MPa^{1/2}$ or less can be appropriately selected while considering an efficiency of extraction, an easiness of operation and so on, and is usually from 10 to 300 parts by weight and preferably from about 20 to 200 parts by weight relative to 100 parts by weight of a glycol or ester solvent solution of a polymer. Further, the amount of added water can be appropriately selected by considering an efficiency of extraction, an easiness of operation and so on, and is usually from 5 to 300 parts by weight and preferably from about 10 to 200 parts by weight relative to 100 parts by weight of a sum of glycol or ester solvent solution of a polymer with the above organic solvent.

An extraction (washing) procedure can be performed by common method and may be carried out by batch process, semi-batch process or continuous process. An extraction procedure may be repeated plural times (for example, from about 2 to 10 times). An extraction temperature can be selected by considering an easiness of operation, solubility and others, and is, for example, from 0° C. to 100° C. and preferably from about 25° C. to 50° C.

An obtained organic solvent layer may be treated in the filtration step to remove impurities. A pore size of filtration material used in the filtration step is, for example, from 1 μm or less, preferably from 0.5 μm or less, and more preferably from 0.3 μm or less.

[Precipitation Purification Step (C)]

In the precipitation purification step (C), a polymer formed by polymerization is precipitated or re-precipitated. By the precipitation purification step, a raw material a monomer and an oligomer can be effectively removed. A solution treated in the precipitation purification step may be a solution containing a polymer formed by polymerization and may be either a polymerization solution (polymer dope) at the end of polymerization or a solution obtained by suitable treatment such as dilution, concentration, filtration, washing and extraction of the polymerization solution. A preferable solution is an organic solvent layer obtained in the said extraction step (B), a solution obtained by filtrating the layer and so on.

A solvent used in a precipitation or re-precipitation (precipitation solvent) may be a poor solvent for a polymer and can be used by appropriately selecting from, for example, hydrocarbons such as an aliphatic hydrocarbon (pentane, hexane, heptane, octane and others), alicyclic hydrocarbons (cyclohexane, methylcyclohexane and others), aromatic hydrocarbons (benzene, toluene, xylene and others); halogenated hydrocarbons such as halogenated aliphatic hydrocarbons (methylene chloride, chroloform, carbon tetrachloride and others) and halogenated aromatic hydrocarbons (chlorobenzene, dichlorobenzene and others); nitro compounds such as nitromethane and nitroethane; nitriles such as acetonitrile and benzonitrile; ethers such as chain ethers (diethyl ether, diisopropyl ether, dimethoxyethane and others) and cyclic ethers (tetrahydrofuran, dioxane and others); ketones such as acetone, methyl ethyl ketone, methyl isobutyl ketone and diisobutyl ketone; esters such as ethyl acetate and butyl acetate; carbonates such as dimethylcarbonate, diethylcarbonate, ethylenecarbonate and propylenecarbonate; alcohols such as methanol, ethanol, propanol, isopropylalcohol and butanol; carboxylic acids such as acetic acid; water; a mixed solvent comprising these solvents; and so on.

In these solvents, as a precipitation solvent, a mixed solvent containing at least a hydrocarbon (particularly, aliphatic hydrocarbons such as hexane and heptane) is preferable. In the mixed solvent containing at least a hydrocarbon, a mixing ratio of a hydrocarbon to other solvent (for example, esters such as ethyl acetate and others) is, for example, a hydrocarbon/other solvent=10/90 to 99/1 (volume ratio at 25° C., the following is the same), preferably 30/70 to 98/2, and more preferably about 50/50 to 97/3.

A preferable procedure of this step is that a solution containing a polymer formed by polymerization and a glycol or ester solvent is added into a solvent containing at least a hydrocarbon to precipitate or re-precipitate the polymer. As the solution containing a polymer formed by polymerization and a glycol or ester solvent, there may be mentioned an organic solvent layer containing a glycol or ester solvent obtained in the said extraction step (B), a solution obtained by filtration treatment of the layer or others.

[Repulping Step (D)]

In the repulsing step (D), a polymer formed by polymerization is repulped with a solvent. By performing this step, a remained monomer and low-molecular weight oligomer sticking on a polymer can be effectively removed. Further, probably because of removing a high-boiling-point solvent having an affinity to a polymer, hardening of the surface of polymer particle, fusion of polymer particles each other and so on can be prevented in the following steps such as the drying step. Thereby a solubility of polymer in a resist solvent is extremely improved and preparation of photoresist resin composition comes to be carried out easily and efficiently.

A material treated in a repulping procedure is the said precipitating-purified polymer (for example, a polymer from which a solvent is removed by decantation, a filtration or others after a precipitation purification) and so on.

As a solvent used in a repulping treatment (repulping solvent), a poor solvent for the polymer used in a precipitation or re-precipitation is preferable. Particularly, a hydrocarbon solvent is more preferable. As a hydrocarbon solvent, there may be mentioned, for example, aliphatic hydrocarbons such as pentane, hexane, heptane and octane, alicyclic hydrocarbons such as cyclohexane and methylcyclohexane, and aromatic hydrocarbons such as benzene, toluene and xylene. Two sorts or more of these solvents may be used by mixture. In these solvents, an aliphatic hydrocarbon, particularly hexane, heptane or a mixed solvent containing hexane or heptane is preferable.

An amount of used repulping solvent is, for example, 1 to 200 times by weight, preferably 5 to 100 times by weight, and more preferably about 10 to 50 times by weight, relative to a polymer. A temperature performing a repulping treatment, being different according to the sorts of used solvent or others, is usually 0° C. to 100° C. and preferably about 10° C. to 60° C. A repulping treatment is performed in a suitable vessel. A repulping treatment may be performed plural times. A treated liquid (repulping liquid) is removed by decantation and so on.

[Rinsing Step (E)]

In the rinsing step (E), a polymer formed by polymerization is rinsed with a solvent. By performing this step, a remained monomer and low-molecular weight oligomer sticking to a polymer can be effectively removed, in the same way as the said repulping step. Further, probably because of removing a high-boiling-point solvent having an affinity to a polymer or not, hardening of a surface of polymer, fusing of polymer particles each other and so on can be prevented in the following drying step. Thereby a solubility of polymer in a resist solvent is extremely improved and a preparation of photoresist resin composition comes to be carried out easily and efficiently. Furthermore, by using water as a rinse solvent, a metal element sticking on a surface of polymer can be efficiently removed. Thereby, a deterioration of resist performance caused by a metal element can be prevented.

A material treated in the rinsing treatment is the precipitating-purified polymer (for example, a polymer obtained by removing a solvent by methods such as decantation after precipitation purification) or a polymer treated in the repulping treatment (for example, polymer obtained by removing solvent by decantation after precipitation purification) or others.

As a solvent used in a rinse treatment (rinse solvent), a poor solvent for a polymer used in a precipitation or re-precipitation is preferable. Particularly, a hydrocarbon solvent is more preferable. As a hydrocarbon, there may be mentioned, for example, aliphatic hydrocarbons such as pentane, hexane, heptane, octane and others, alicyclic hydrocarbons such as cyclohexane and methylcyclohexane, and aromatic hydrocarbons such as benzene, toluene and xylene. Two sorts or more of these solvents may be used by mixture. In these solvents, an aliphatic hydrocarbon, particularly hexane or heptane, or a mixed solvent containing hexane or heptane is preferable. Further, in order to remove a metal element from a polymer, water and particularly water having Na content of 5 ppb by weight or less (preferably 3 ppb by weight or less and more preferably 1.5 ppb by weight or less), for example super-pure water, is preferable as a rinse solvent.

An amount of used rinse solvent is, for example, 1 to 100 times by weight and preferably about 2 to 20 times by weight relative to a polymer. A temperature performing a rinse treatment, being different according to the sorts of used solvent or others, is usually 0° C. to 100° C. and preferably about 10° C. to 60° C. A rinse treatment is performed in a suitable vessel. A rinse treatment may be performed plural times. Particularly, performing a rinse treatment using a hydrocarbon solvent and a rinse treatment using water in combination is preferable. A treated liquid (rinse liquid) is removed by decantation, filtration and so on.

[Drying Step (F)]

In the drying step (F), the polymer produced by polymerization is subjected to precipitation purification, and if necessary, is treated by the repulping treatment and/or the rinse treatment, and subsequently the resulting polymer is dried. A drying temperature of polymer is, for example, 20° C. to 120° C. and preferably about 40° C. to 100° C. The drying is performed under a reduced pressure, for example 200 mmHg (26.6 kPa) or less and preferably 100 mmHg (13.3 kPa) or less.

[Redissolving Step (G)]

In the redissolving step (G), the polymer produced by polymerization is subjected to precipitation purification, and if necessary, is treated by the repulping treatment, the rinse treatment, and/or the drying treatment, and subsequently the resulting polymer is allowed to resolve in organic solvent (resist solvent) to prepare the polymer solution. This polymer solution can be applied to a photoresist polymer solution (a concentration of polymer of about 10 to 40% by weight). Such organic solvents include, but are not limited to, the solvents exemplified as the polymerization solvents such as glycols solvent, esters solvent, ketones solvent, and a mixed solvent thereof. Among these solvents, propylene glycol monomethyl ether, propylene glycol monomethyl ether acetate, ethyl lactate, methyl isobutyl ketone, methyl amyl ketone and a mixed solvent thereof are preferable and particularly solvents containing at least propylene glycol monomethyl ether acetate such as a single solvent of propylene glycol monomethyl ether acetate, a mixed solvent of propylene glycol monomethyl ether acetate with propylene glycol monomethyl ether and a mixed solvent of propylene glycol monomethyl ether acetate with ethyl lactate can be appropriately used.

[Evaporating Step (H)]

In the evaporating step (H), the polymer solution obtained in the said redissolving step (G) is concentrated and a low-boiling-point solvent contained in the polymer solution (for example, solvents used as the polymerization solvent, the extraction solvent, the precipitating solvent, the repulping solvent and the rinse solvent) is removed by evaporating to prepare a photoresist polymer solution. The evaporating step (H) is useful in case of containing a low-boiling-point solvent in the polymer solution obtained in the redissolving step (G), for example, in case of the process comprising the redissolving step (G) without the drying step (F). In case of including the evaporating step (H), equal to or more than the required amount of organic solvent (resist solvent) in preparation of photoresist polymer solution is added and the resulting solution is concentrated to a desired polymer concentration (for example, about 10 to 40% by weight) in the redissolving step (G). The concentration can be performed at atmospheric pressure or under a reduced pressure.

Further, the photoresist polymer solution is added a photo-acid generator, and if necessary, various additives and is applied to a manufacture of semiconductor.

[Passing Liquid Step (I)]

In the passing liquid step (I), a polymer solution which contains a polymer (hereinafter, it may be described as "polymer P") having a repeated unit corresponding to at least one monomer selected from the above monomers, (a), (b) and (c), and of which a metal content is 1000 ppb by weight or less relative to the above polymer P is subjected to passing through a filter constituted by a porous polyolefin membrane having a cation-exchange group.

The polymer P may contain one of a repeated unit corresponding to a monomer (a) [for example, a repeated unit corresponding to a (meth) acrylic acid ester monomer represented by the above formula (1a), (1b) or (1c) (such as a repeated unit formed by polymerization of an acryl moiety) and others], a repeated unit corresponding to the monomer (b) [for example, a repeated unit corresponding to a (meth) acrylic acid ester monomer represented by the above formula (2a) or (2b) (such as a repeated unit formed by polymerization of an acryl moiety), and others] and a repeated unit corresponding to the monomer (c) [for example, a repeated unit corresponding to a (meth) acrylic acid ester monomer represented by the above formula (3a) (such as a repeated unit formed by polymerization of an acryl moiety) and others]. Further, the polymer P containing two or more, particularly three among the above three repeated units are preferable. In addition, the polymer P may, if necessary, contain other repeated unit.

The said polymer P can be synthesized by the process of the above step (A). In detail, at least one monomer (an acryl monomer, an olefin monomer and others) selected from a monomer having a lactone skeleton, a monomer having a group which becomes soluble in alkali by elimination with an acid and a monomer containing a alicyclic skeleton having a hydroxyl group, and if necessary, other monomers are polymerized and thereby the polymer is synthesized. Polymerization can be performed by conventional techniques such as solution polymerization and melt polymerization. A monomer having a low metal content, for example, a monomer having a metal content of 100 ppb by weight or less is preferably employed as a monomer.

A solvent for a solution containing the polymer P is not limited particularly. There may be mentioned, for example, esters such as ethyl acetate, butyl acetate, propylene glycol monomethyl ether acetate, ethyl lactate and ethyl benzoate; ketones such as acetone, ethyl methyl ketone, diethyl ketone, isobutyl methyl ketone and t-butyl methyl ketone; chain or cyclic ethers such as diethyl ether, diisopropyl ether, t-butyl methyl ether, dibutyl ether, dimethoxy ethane, propylene glycol monomethyl ether, anisole, dioxane and tetrahydrofuran; alcohols such as methanol, ethanol, isopropyl alcohol and butanol; nitrites such as acetonitrile, propionitrile and benzonitrile; aromatic hydrocarbons such as benzene, toluene, xylene and ethylbenzene; aliphatic hydrocarbons such as hexane, heptane and octane; alicyclic hydrocarbons such as cyclohexane; halogenated hydrocarbons such as dichloromethane, 1,2-dichloroethane and chlorobenzene; amides such as N,N-dimethylformamide; carbon disulfide; water; a mixed solvent thereof; and others. Among these solvents, esters, ketones, mixed solvents containing these solvents and others are preferable. The said solvent may be a polymerization solvent and also may be a solvent replaced from a polymerization solvent.

A cation-exchange group constituting the porous polyolefin membrane includes a strong-acidity cation-exchange group such as a sulfonic acid group, a weak-acidity cation-exchange group such as a carboxyl group and others. As a polyolefin constituting the polyolefin membrane, for example, polyethylenes such as high-density polyethylene, polypropylene and others are represented.

As a filter constituted by the porous polyolefin membrane having a cation-exchange group, a hydrophilic one is preferable and, for example, "IONCLEAN", trade name of a product available from Nihon Pole Ltd. and others are appropriately used.

In the step (I), when a solution containing the said polymer P (photoresist polymeric compound) is passed through a filter constituted by a porous polyolefin membrane having a cation-exchange group to remove a metal ion, and thereby a hydrogen ion (acid) is stoichiometrically generated. Because this hydrogen ion causes an acid-eliminating group of the polymer P to eliminate to thereby deteriorate a resist performance, the hydrogen ion is preferably as few as possible. Therefore, a metal content of solution containing the polymer P provided to a filter constituted by a porous polyolefin membrane having a cation-exchange group is 1000 ppb by weight or less (for example, 10 to 1000 ppb by weight), preferably 800 ppb by weight or less (for example, 10 to 800 ppb by weight), and more preferably 500 ppb by weight or less (for example, 10 to 500 ppb by weight) relative to the polymer P. In case that the said metal content exceeds 1000 ppb by weight, a hydrogen ion concentration of the solution passed through a filter increases and to thereby deteriorate a resist performance.

Flow rate in passing a solution containing the polymer P through filter is different according to the sorts of material for polyolefin membrane, the sorts of solution (solvent) or others and can be appropriately selected in a range of not deteriorating a metal-removing efficiency (for example, from about 100 ml/min to 100 L/min). A temperature in passing through filter is commonly from 0° C. to 80° C. and preferably from about 10° C. to 50° C. When the temperature is too high, there is some fear of deterioration of a filter, decomposition of a solvent or others. When the temperature is too low, a viscosity of a solution becomes high and thereby passing is likely to be difficult.

By passing a solution containing the polymer P through the said filter, metal ions such as sodium ion and iron ion contained in the solution are efficiently removed and a polymer solution having a metal content on the basis of polymer of, for example, 200 ppb by weight or less and preferably 100 ppb by weight or less can be obtained. Therefore, in case of using the polymer P as a resin component of photoresist resin composition, it comes not to make any bad influence on electrical characteristics of semiconductor and so on.

[Filtration Step (J)]

In the present invention, the filtration step (J) in which a solution containing the polymer P is filtrated to remove insolubles may be performed before the above step (I). By performing the filtration step (J), a blockage in the step (I) can be prevented and various troubles caused by a contamination of foreign matter can be prevented in case of forming a pattern using a photoresist resin composition as well as.

A filter material used in the filtration step (J) isn't particularly limited and commonly a membrane filter and others are employed. A pore size of a filter material is usually from 0.01 to 10 μm, preferably from 0.02 to 1 μm, and more preferably from about 0.05 to about 0.5 μm.

[Water Washing Treatment Step (K)]

In the present invention, the water washing treatment step (K) in which a metal content of the solution is deceased by washing the solution containing the polymer P with water may be performed before the step (I). Performing water washing treatment step (K) before the step (I) brings a big advantage. Such advantage not only includes that an water-soluble metal compound can be efficiently removed and to thereby reduce a load on the step (I), but also includes that the amount of hydrogen ion generated accompanied with removal of metal ion in the step (I) can be reduced and to thereby prevent from the deterioration of a resist performance. Particularly, when a metal content of solution containing the polymer P exceeds 1000 ppb by weight, it is possible to provide the step (I) with a solution having a metal content of the solution to be reduced to 1000 ppb by weight or less in the water washing treatment step (K).

As water used in the water washing treatment step (K), water of which a metal content is few, and for example, super-pure water of which a metal content is 1 ppb by weight or less, is preferable. An amount of water is, for example, from 10 to 1000 parts by weight and preferably from about 30 to about 300 parts by weight relative to 100 parts by weight of treated liquid. A temperature in the water washing treatment is, for example, from about 10° C. to about 50° C. Further, the water washing treatment step alone can reduce a metal content in a polymer solution to a desired level without the step (I), however, in this case large amount of waste water containing metal is generated and the treatment thereof needs some running cost, which is a disadvantage.

When the said filtration step (J) and the water washing treatment step (K) are performed, an order of the both steps isn't restricted and however the filtration step (J) is usually performed previously.

In the present invention, if necessary, a step of performing other adsorption treatment of a solution containing the polymer P to may be carried out except for the above steps. Such other adsorption treatment includes, for example, an active carbon treatment, a chelate resin treatment, a chelate fiber treatment, a zeta potential membrane treatment, and so on.

Further, each of the above steps (B), (C), (D), (E), (F), (G) and (H) can be performed before or after the said step (I).

A solution containing the polymer P (photoresist polymeric compound) performed by the above steps is used for preparation of photoresist resin composition as intact or after isolation of the polymer by precipitation, a re-precipitation or other treatments.

A solvent (precipitation solvent) used for precipitation or re-precipitation may be a poor solvent toward a polymer and can be used by appropriately selecting from, for example, hydrocarbons such as aliphatic hydrocarbons (e.g. pentane, hexane, heptane, octane and so on), alicyclic hydrocarbons (e.g. cyclohexane, methylcyclohexane and so on), aromatic hydrocarbons (e.g. benzene, toluene, xylene and so on); halogenated hydrocarbons such as halogenated aliphatic hydrocarbons (e.g. methylene chloride, chloroform, carbon tetrachloride and so on) and halogenated aromatic hydrocarbons (e.g. chlorobenzene, dichlorobenzene and so on); nitro compounds such as nitromethane and nitroethane; nitrites such as acetonitrile and benzonitrile; ethers such as chain ethers (e.g. diethyl ether, diisopropyl ether, dimethoxy ethane and so on) and cyclic ethers (e.g. tetrahydrofuran, dioxane and so on); ketones such as acetone, methyl ethyl ketone, methyl isobutyl ketone and diisobutyl ketone; esters such as ethyl acetate and butyl acetate; carbonates such as dimethyl carbonate, diethyl carbonate, ethylene carbonate and propylene carbonate; alcohols such as methanol, ethanol, propanol, isopropyl alcohol and butanol; carboxylic acids such as acetic acid; water; a mixed solvent containing these solvents; and others. Among these solvents, as a precipitation solvent a mixed solvent containing at least hydrocarbons (particularly, aliphatic hydrocarbons such as hexane and heptane) are preferable. In the mixed solvent containing at least hydrocarbons, a mixing ratio of hydrocarbons with another solvent (e.g. esters such as ethyl acetate) is, for example, hydrocarbons/another solvent=10/90 to 99/1 (ratio by volume at 25° C., which has the same meaning hereinafter), preferably from 30/70 to 98/2, and more preferably from about 50/50 to about 97/3. As a precipitation solvent, a solvent having a low metal content, for example, metal content of 50 ppb by weight or less, is preferably used.

INDUSTRIAL APPLICABILITY

The process for producing photoresist polymeric compounds of the present invention can efficiently provide a photoresist polymeric compound having an impurity such as metal content of extremely few. Further, particularly in case of performing the said steps (A) and (B) in the process, the process can efficiently provide a photoresist polymeric compound dissolving in a photoresist solvent easily and certainly.

In addition, particularly in case of including the said step (I), when the photoresist polymeric compound is used as a resin component of photoresist resin composition, a desired resist performance can be obtained because a metal component having a bad influence upon electrical characteristics can be efficiently removed.

EXAMPLES

Hereinafter, the present invention will be described in further detail with reference to several examples, which are not intended to limit the scope of the invention. Additionally, the numerals in the right bottom of parentheses written in the formulae of Examples 11, 13, 14 and 15 represents % by mole of monomer units (repeated units). In Examples 11 to 15 and Comparative Examples 4 to 6, monomers having metal content of 100 ppb by weight or less were used. In regard to propylene glycol monomethyl ether acetate (PGMEA) and methyl isobutyl ketone (MIBK), commercially available agents were distilled by a glass-made distillation equipment to become metal content of 50 ppb by weight or less before and the results are used in Example 11. In Examples except for Example 11, commercially available agents were used as intact. In Examples 11 to 15 and Comparative Examples 4 to 6, solvents (ethyl acetate, hexane) used in the precipitation procedure and the repulping procedure is the solvent distilled by a glass-made distillation equipment to become metal content of 50 ppb by weight or less before use, and in regard to water, super-pure water (provided by allowing pure water to ion-exchange treatment and then treating by membrane to become metal content of 1 ppb by weight or less) was used. The metal content was determined by an induction coupling plasma mass spectroscopy (ICP-MS) and represented by value (ppb) relative to the amount of polymer obtained finally. The term "ppb" means "ppb by weight".

Example 1

Production of photoresist polymeric compound with following structure

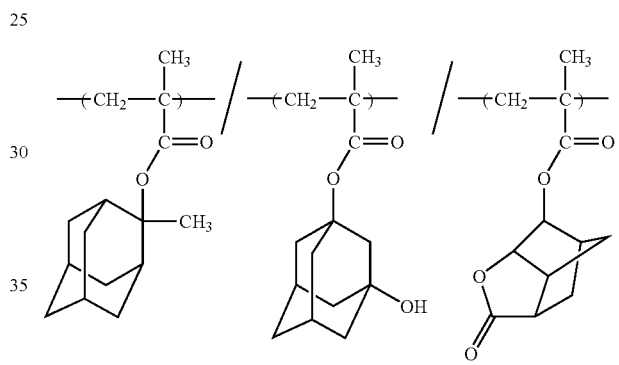

In an separable flask equipped with a stirrer, a thermometer, a refluxing condenser, a dropping funnel and a nitrogen gas introducing tube, 33 g of propylene glycol monomethyl ether acetate (PGMEA) was charged and after the solution was raised in temperature up to 75° C., a mixed solution containing 5 g of 1-hydroxy-3-methacryloyloxyadamantane (HMA), 5 g of 5-methacryloyloxy-2,6-norbornane carbolactone (MNBL), 5 g of 2-methacryloyloxy-2-methyladamantane (2-MMA), 0.93 g of dimethyl-2,2'-azobis(2-methylpropionate) (initiator; "V-601", produced by Wako Pure Chemical Industries, Ltd.) and 41 g of propylene glycol monomethyl ether acetate (PGMEA) was added by dropping over 6 hours. After dropping, the resulting mixture was aged for 2 hours. 54 g of methyl isobutyl ketone (MIBK) (35° C.) was added to the obtained reaction mixture (polymer dope) (35° C.) and to the obtained polymer solution, water of the same weight as the polymer solution was added. The resulting mixture was stirred at 35° C. for 30 minutes and thereafter was kept standing for 30 minutes to separate the mixture. After removing the lower layer (aqueous layer), new water of the same amount as the upper layer (organic layer) was added to the upper layer, was stirred again at 35° C. for 30 minutes and was kept standing for 30 minutes, and the lower layer (aqueous layer) was removed. After passing the upper layer (organic layer) (35° C.) through a filter having micro-hole diameter of 0.5 μm and a filter having that of 0.1 μm, the resulting mixture was added dropwise to the mixture (35° C.) of 656 g of heptane and 219 g of ethyl acetate, and after the completion of adding dropwise, the resulting solution was stirred for 60 minutes and was kept standing for 90 minutes. The precipitation purification was performed by these procedures.

After removing 640 g of supernatant, 640 g of heptane was added to the residue and the repulping procedure was performed at 35° C. The repulping procedure was performed by adding heptane, stirring for 30 minutes, keeping standing for 90 minutes and removing the supernatant. The repulping procedure was performed twice in all. After removing the supernatant, the residue was transfer to a centrifuge to remove liquid under 600 G of centrifugal force and to thereby yield a wet polymer. 65 g of heptane was added to the wet polymer and a rinse procedure was performed under 600 G of centrifugal force to remove rinsing liquid. Then 100 g of super-pure water (Na content of 0.9 ppb by weight) was added and was rinsed under 600 G of centrifugal force to remove rinsing liquid.

The resulting wet polymer was taken out and was added to a tray dryer to dry under 20 mmHg (2.66 kPa) at 70° C. for 30 hours, and 10.5 g of photoresist polymer (ArF resist resin) was obtained. The photoresist polymer was dissolved in 31.5 g of PGMEA to prepare the photoresist polymer solution.

The obtained photoresist polymer had a weight average molecular weight of 8250, a molecular weight distribution of 1.74, and the metal contents on the basis of the polymer weight were Na of 95 ppb by weight, Mg of 40 ppb by weight, K of 40 ppb by weight, Ca of 45 ppb by weight, Zn of 48 ppb by weight, Fe of 38 ppb by weight, Al of 20 ppb by weight, Cr of 20 ppb by weight, Mn of 35 ppb by weight, Ni of 20 ppb by weight, and Cu of 20 ppb by weight and the polymer contained 0.05% by weight of MNBL, 0.05% by weight of HMA, and 0.08% by weight of 2-MMA as remained monomers, 2.5% by weight of remained solvent and 0.5% by weight of moisture. In addition, the solubility of photoresist polymer in PGMEA was good.

Example 2

In the same way as in Example 1, the reaction (polymerization), the water washing (extraction), the filtration and the precipitation purification were performed. Then, after removing 640 g of the supernatant made in the precipitation purification, the residue was transferred to a centrifuge to remove liquid under 600 G of centrifugal force and the wet polymer was obtained. 65 g of heptane was added to the wet polymer and the rinsing procedure was performed under 600 G of centrifugal force to remove rinsing liquid. Then 100 g of super-pure water (Na content; 0.9 ppb by weight) was added and the residue was rinsed under 600 G of centrifugal force to remove rinsing liquid.

The obtained wet polymer (42 g) was dissolved in 63 g of methyl amyl ketone. By concentrating the resulting solution (from atmospheric pressure to 2.66 kPa; from room temperature to 75° C.), 42 g of 25% by weight of photoresist polymer solution was obtained.

The obtained photoresist polymer had a weight average molecular weight of 8200, a molecular weight distribution of 1.75, and the metal contents on the basis of the polymer weight were Na of 94 ppb by weight, Mg of 30 ppb by weight, K of 35 ppb by weight, Ca of 40 ppb by weight, Zn of 50 ppb by weight, Fe of 42 ppb by weight, Al of 20 ppb by weight, Cr of 20 ppb by weight, Mn of 5 ppb by weight, Ni of 5 ppb by weight, and Cu of 10 ppb by weight and the polymer contained 0.09% by weight of MNBL, 0.09% by weight of HMA, and 0.11% by weight of 2-MMA as remained monomers.

Comparative Example 1

A photoresist polymer solution was obtained in the same manner as in Example 2 except that the water washing (extracting) procedure wasn't performed. In the obtained photoresist polymer, the metal contents on the basis of the polymer weight were Na of 550 ppb by weight, Mg of 80 ppb by weight, K of 240 ppb by weight, Ca of 300 ppb by weight, Zn of 250 ppb by weight, Fe of 300 ppb by weight, Al of 200 ppb by weight, Cr of 80 ppb by weight, Mn of 30 ppb by weight, Ni of 30 ppb by weight, and Cu of 40 ppb by weight.

Example 3

A reaction (polymerization) was performed in the same manner as in Example 1. The obtained reaction liquid (polymer dope) (35° C.) was passed through a filter having microhole diameter of 0.5 μm and a filter having that of 0.1 μm and then was added drop by drop into the mixture (35° C.) containing 656 g of heptane and 219 g of ethyl acetate, and after completion of adding dropwise, the resulting solution was stirred for 60 minutes and was kept standing for 90 minutes. The precipitation purification was performed by these procedures. After removing the supernatant made in the precipitation purification, the residue was transferred to a centrifuge to remove liquid under 600 G of centrifugal force and the wet polymer was obtained. The wet polymer was added into 63 g of methyl amyl ketone (MAK) and dissolved at 60° C. In the resulting polymer solution, the same weight of water was added. The resulting mixture was stirred at 35° C. for 30 minutes and thereafter was kept standing for 30 minutes to separate. After removing the lower layer (aqueous layer), newly water of the same amount as the upper layer (organic layer) was added and the resulting mixture was again stirred at 35° C. for 30 minutes and was kept standing for 30 minutes and the lower layer (aqueous layer) was removed. The upper layer (organic layer) was concentrated (from atmospheric pressure to 2.66 kPa; from room temperature to 75° C.) and 42 g of 25% by weight of photoresist polymer solution was obtained.

The obtained photoresist polymer had a weight average molecular weight of 8280, a molecular weight distribution of 1.76, and the metal contents on the basis of the polymer weight were Na of 85 ppb by weight, Mg of 25 ppb by weight, K of 30 ppb by weight, Ca of 35 ppb by weight, Zn of 45 ppb by weight, Fe of 40 ppb by weight, Al of 15 ppb by weight, Cr of 15 ppb by weight, Mn of 5 ppb by weight, Ni of 5 ppb by weight, and Cu of 10 ppb by weight and the polymer contained 0.09% by weight of MNBL, 0.08% by weight of HMA, and 0.10% by weight of 2-MMA as remained monomers.

Example 4

Production of photoresist polymeric compound with following structure

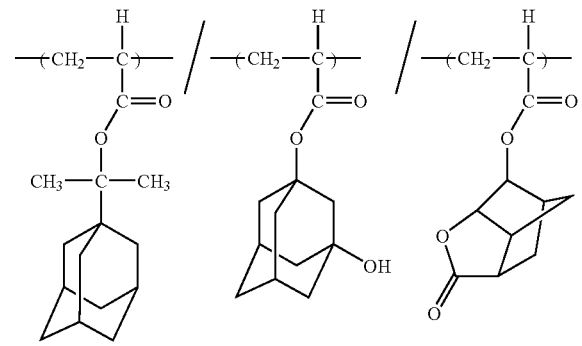

In an separable flask equipped with a stirrer, a thermometer, a refluxing condenser, a dropping funnel and a nitrogen gas introducing tube, 12.0 g of propylene glycol monomethyl ether acetate (PGMEA) was charged and after raising the temperature to 75° C., the mixed solution containing 3.37 g of 1-acryloyloxy-3-hydroxyadamantane (HAA), 3.60 g of 5-acryloyloxy-2,6-norbornane carbolactone (ANBL), 8.03 g of 1-(1-acryloyloxy-1-methylethyl)adamantane (IAA), 0.85 g of dimethyl-2,2'-azobis(2-methylpropionate) (initiator; "V-601" produced by Wako Pure Chemical Industries, Ltd.) and 48 g of propylene glycol monomethyl ether acetate (PGMEA) was added by dropping over 6 hours. After dropping, the resulting mixture was aged for 2 hours. After the obtained reaction mixture (polymer dope) (30° C.) was passed through a filter having 0.5 µm of pore size, 75 g of methyl isobutyl ketone (MIBK) (30° C.) was added to the mixture and water of the same weight as the obtained polymer solution was added to the obtained polymer. The resulting mixture was stirred at 30° C. for 30 minutes and thereafter was kept standing for 30 minutes to separate. After removing the lower layer (aqueous layer), newly water of the same amount as the upper layer was added into the upper layer (organic layer) and the resulting mixture was again stirred at 30° C. for 30 minutes and was kept standing for 30 minutes to remove the lower layer (aqueous layer). After passing the upper layer (organic layer) (30° C.) through a filter having 0.1 µm of pore size, the resulting mixture was added drop by drop into the mixture (30° C.) containing 832 g of heptane and 92 g of ethyl acetate, and after completion of adding dropwise, the resulting solution was stirred for 60 minutes. The precipitation purification was performed by these procedures.

This residue was transferred to a centrifuge to remove liquid under 600 G of centrifugal force and the wet polymer was obtained. 116 g of heptane was added to the wet polymer and a rinsing procedure was performed under 600 G of centrifugal force to remove rinsing liquid. Then 110 g of superpure water (Na content; 0.1 ppb by weight) was added and the residue was rinsed under 600 G of centrifugal force to remove rinsing liquid.

The resulting wet polymer was taken out and was transferred to a tray dryer to dry under 20 mmHg (2.66 kPa) at 45° C. for 65 hours, and 12 g of photoresist polymer (ArF resist resin) was obtained. The photoresist polymer was dissolved in 36 g of PGMEA to prepare the photoresist polymer solution.

The obtained photoresist polymer had a weight average molecular weight of 15000, a molecular weight distribution of 2.50, and the Na content on the basis of the polymer weight was 70 ppb by weight. In addition, the solubility of photoresist polymer in PGMEA was good.

Example 5

In the same way as in Example 4, the reaction (polymerization), the water washing (extraction), the filtration, the precipitation purification and the rinsing procedure were performed. The obtained wet polymer (24 g) was dissolved in 96 g of PGMEA. The resulting solution was concentrated (from atmospheric pressure to 8 kPa; from room temperature to 80° C.) and 48 g of 25% by weight of photoresist polymer solution was obtained.

The obtained photoresist polymer had a weight average molecular weight of 14800, a molecular weight distribution of 2.45, and the Na content on the basis of the polymer weight was 65 ppb by weight. In addition, the solubility of photoresist polymer in PGMEA was good.

Comparative Example 2

A photoresist polymer solution was obtained in the same manner as in Example 5, except that the water washing (extracting) procedure wasn't performed. In the obtained photoresist polymer, the metal contents on the basis of the polymer weight were Na of 500 ppb by weight, Mg of 70 ppb by weight, K of 150 ppb by weight, Ca of 480 ppb by weight, Zn of 840 ppb by weight, Fe of 150 ppb by weight, Al of 80 ppb by weight, Cr of 70 ppb by weight, Mn of 40 ppb by weight, Ni of 40 ppb by weight, and Cu of 40 ppb by weight.

Example 6

Production of photoresist polymeric compound with following structure

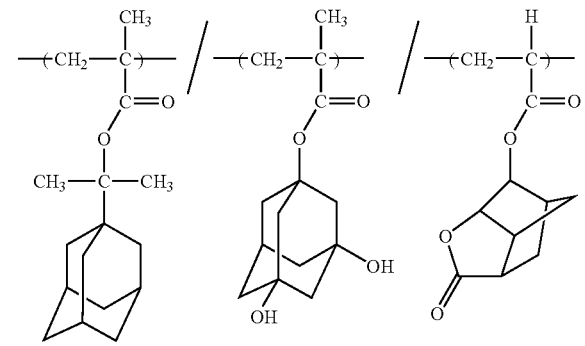

In an separable flask equipped with a stirrer, a thermometer, a refluxing condenser, a dropping funnel and a nitrogen gas introducing tube, 23.6 g of propylene glycol monomethyl ether acetate (PGMEA) and 10.1 g of propylene glycol monomethyl ether (PGME) were charged and after raising the temperature to 100° C., the mixed solution containing 2.72 g of 1,3-dihydroxy-5-methacryloyloxyadamantane (DHMA), 6.74 g of 5-acryloyloxy-2,6-norbornane carbolactone (ANBL), 7.54 g of 1-(1-methacryloyloxy-1-methylethyl) adamantane (IAM), 0.15 g of dimethyl-2,2'-azobis(2-methylpropionate) (initiator; "V-601" produced by Wako Pure Chemical Industries, Ltd.) and 43.8 g of propylene glycol monomethyl ether acetate (PGMEA) and 18.8 g of propylene glycol monomethyl ether (PGME) were added by dropping over 6 hours. After dropping, the resulting mixture was aged for 2 hours. After the obtained reaction mixture (polymer dope) (35° C.) was passed through a filter having 0.5 µm of pore size, 56.7 g of methyl isobutyl ketone (MIBK) (35° C.) was added to the mixture and then water of the half weight of the obtained polymer was added to the obtained polymer solution. The resulting mixture was stirred at 35° C. for 30 minutes and thereafter was kept standing for 30 minutes to separate. After removing the lower layer (aqueous layer), newly water of the half amount of the upper layer (organic layer) was added into the upper layer and the resulting mixture was again stirred at 35° C. for 30 minutes and was kept standing for 30 minutes and the lower layer (aqueous layer) was removed. After passing the upper layer (organic layer) (35° C.) through filter having 0.1 µm of pore size, the resulting mixture was added drop by drop into the mixture (35° C.) containing 913.5 g of heptane and 136.5 g of ethyl acetate, and after completion of adding dropwise, the resulting solution was stirred for 30 minutes. The precipitation purification was performed by these procedures.

This residue was transferred to a centrifuge to remove liquid under 600 G of centrifugal force and the wet polymer was obtained. 210 g of heptane was added to the wet polymer and a rinsing procedure was performed under 600 G of centrifugal force to remove rinsing liquid. Then 210 g of super-pure water (Na content of 0.8 ppb by weight) was added and was rinsed under 600 G of centrifugal force to remove rinsing liquid.

The resulting wet polymer was taken out and transferred to a tray dryer to dry under 20 mmHg (2.66 kPa) at 45° C. for 40 hours, and 14 g of photoresist polymer (ArF resist resin) was obtained. The photoresist polymer was dissolved in the mixed solvent containing 29 g of PGMEA and 13 g of PGME to prepare the photoresist polymer solution.

The obtained photoresist polymer had a weight average molecular weight of 9700, a molecular weight distribution of 2.14, and the Na content on the basis of the polymer weight was 50 ppb by weight. In addition, the solubility of photoresist polymer in the mixed solvent of PGMEA/PGME [=7/3 (weight ratio)] was good.

Example 7

In the same way as in Example 6, the reaction (polymerization), the water washing (extraction), the filtration, the precipitation purification and the rinsing procedure were performed. The obtained wet polymer (42 g) was dissolved in 98 g of the mixed solvent of PGMEA/PGME [=7/3 (ratio by weight)]. The resulting solution was concentrated (from atmospheric pressure to 8 kPa; from room temperature to 70° C.) and 56 g of 25% by weight of photoresist polymer solution was obtained.

The obtained photoresist polymer had a weight average molecular weight of 9750, a molecular weight distribution of 2.12, and the Na content on the basis of the polymer weight was 48 ppb by weight.

Comparative Example 3

A photoresist polymer solution was obtained in the same manner as in Example 7, except that the water washing (extracting) procedure wasn't performed. In the obtained photoresist polymer, the metal contents on the basis of the polymer weight were Na of 800 ppb by weight, Mg of 70 ppb by weight, K of 140 ppb by weight, Ca of 150 ppb by weight, Zn of 190 ppb by weight, Fe of 140 ppb by weight, Al of 90 ppb by weight, Cr of 70 ppb by weight, Mn of 30 ppb by weight, Ni of 30 ppb by weight, and Cu of 30 ppb by weight.

Example 8

In the same manner as in Example 1 except that 1.16 g of 2,2'-azobis[2-methyl-N-(2-hydroxyethyl)propionamide] (initiator; "VA-086" produced by Wako Pure Chemical Industries, Ltd.) instead of 0.93 g of dimethyl-2,2'-azobis(2-methylpropionate) (initiator; "V-601" produced by Wako Pure Chemical Industries, Ltd.) as a polymerization initiator, 41 g of ethyl lactate instead of 33 g of propylene glycol monomethyl ether acetate (PGMEA) as the solvent as the solvent firstly charged to the flask, and 41 g of ethyl lactate instead of 41 g of propylene glycol monomethyl ether acetate (PGMEA) as the solvent of the mixed solution for dropping were employed, 10.2 g of a photoresist polymer (ArF resist resin) was obtained. In addition, by employing the polymer, a photoresist polymer solution was obtained in the same manner as in Example 1.

The obtained photoresist polymer had a weight average molecular weight of 8350, a molecular weight distribution of 1.80, and the metal contents on the basis of the polymer weight were Na of 85 ppb by weight, Mg of 43 ppb by weight, K of 30 ppb by weight, Ca of 50 ppb by weight, Zn of 44 ppb by weight, Fe of 30 ppb by weight, Al of 15 ppb by weight, Cr of 20 ppb by weight, Mn of 30 ppb by weight, Ni of 25 ppb by weight, and Cu of 20 ppb by weight, and the polymer contained 0.05% by weight of MNBL, 0.05% by weight of HMA, and 0.06% by weight of 2-MMA as remained monomers, 2.5% by weight of remained solvent and 0.5% by weight of water. In addition, the solubility of photoresist polymer in PGMEA was good.

Example 9

In the same manner as in Example 4 except that 1.16 g of 2,2'-azobis[2-methyl-N-(2-hydroxyethyl)propionamide] (initiator; "VA-086" produced by Wako Pure Chemical Industries, Ltd.) instead of 0.85 g of dimethyl-2,2'-azobis(2-methylpropionate) (initiator; "V-601" produced by Wako Pure Chemical Industries, Ltd.) as a polymerization initiator, 12.0 g of ethyl lactate instead of 12.0 g of propylene glycol monomethyl ether acetate (PGMEA) as the solvent firstly charged to the flask and 48 g of ethyl lactate instead of 48 g of propylene glycol monomethyl ether acetate (PGMEA) as the solvent of the mixed solution for dropping were employed, 11.5 g of a photoresist polymer (ArF resist resin) was obtained. In addition, by employing the polymer, a photoresist polymer solution was obtained in the same manner as in Example 4.

The obtained photoresist polymer had a weight average molecular weight of 14500, a molecular weight distribution of 2.35, and the metal contents on the basis of the polymer weight were Na of 60 ppb by weight. In addition, the solubility of photoresist polymer in PGMEA was good.

Example 10

In the same manner as in Example 6 except that 0.19 g of 2,2'-azobis[2-methyl-N-(2-hydroxyethyl)propionamido] (initiator; "VA-086" produced by Wako Pure Chemical Industries, Ltd.) instead of 0.15 g of dimethyl-2,2'-azobis(2-methylpropionate) (initiator; "V-601" produced by Wako Pure Chemical Industries, Ltd.) as a polymerization initiator, 33.7 g of ethyl lactate instead of 23.6 g of propylene glycol monomethyl ether acetate (PGMEA) and 10.1 g of propylene glycol monomethyl ether (PGME) as the solvent firstly charged to the flask, and 62.6 g of ethyl lactate instead of 43.8 g of propylene glycol monomethyl ether acetate (PGMEA) and 18.8 g of propylene glycol monomethyl ether (PGME) as the solvent of the mixed solution for dropping, 12.8 g of a photoresist polymer (ArF resist resin) was obtained. In addition, by employing the polymer, a photoresist polymer solution was obtained in the same manner as in Example 6.

The obtained photoresist polymer had a weight average molecular weight of 10500, a molecular weight distribution of 2.20, and the Na content on the basis of the polymer weight was 55 ppb by weight. In addition, the solubility of photoresist polymer in the mixed solvent of PGMEA/PGME [=7/3 (ratio by weight)] was good.

Example 11

Production of photoresist polymeric compound with following structure

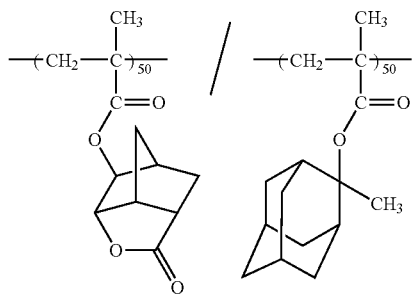

In a reactor equipped with a stirrer, a thermometer, a refluxing condenser, a dropping tube and a nitrogen gas introducing tube, 70 g of propylene glycol monomethyl ether acetate (PGMEA) was charged and after raising the temperature to 100° C., the mixed solution containing 73.0 g of 5-methacryloyloxy-2,6-norbornane carbolactone (MNBL)(metal content of 100 ppb or less), 77.0 g of 2-methacryloyloxy-2-methyladamantane (2-MMA), 1.8 g of azobisisobutyronitrile and 530 g of PGMEA was added by dropping over 6 hours. After dropping, the resulting mixture was aged for 2 hours and the polymer solution containing 20% by weight of the polymeric compound represented by the above formula was obtained. The polymer solution was passed through a membrane filter having 0.5 μm of pore size and then 750 g of methyl isobutyl ketone (MIBK) was added. At that time, the metal content in the polymer solution was 450 ppb.

The polymer solution was passed through "IONCLEAN" (trade name) (produced by Nihon Pole Ltd. the quality of material: the super high molecular weight polyethylene of chemical modified type, the filtration area: 0.11 m²) constituted by a porous polyolefin membrane having a cation-exchange group at 100 g/min of flow rate at room temperature.

The obtained solution was dropped into a mixed solvent of 6750 g of hexane and 2250 g of ethyl acetate and the resulting precipitate was repulped with 6500 g of hexane. The supernatant was removed, the residue was transferred to a centrifuge and the wet polymer was obtained by removing liquid. The obtained polymer was taken out, was dried under 20 mmHg (2.66 kPa) at 70° C. for 30 hours and 108 g of the product polymer was obtained. The metal content in the product polymer was 50 ppb.

Comparative Example 4

A polymer solution was obtained in the same manner as in Example 11 except that a commercially available product of PGMEA was used as intact. The polymer solution was passed through a membrane filter having 0.5 μm of pore size and then 750 g of commercially available methyl isobutyl ketone (MIBK) was added. At that time, the metal content in the polymer solution was 1200 ppb.

The polymer solution was passed through "IONCLEAN" (trade name) (produced by Nippon pole Co. Ltd., the quality of material: the super high molecular weight polyethylene of chemical modified type, the filtration area: 0.11 m²) constituted by a porous polyolefin membrane having a cation-exchange group at 100 g/min of flow rate at room temperature.

The obtained solution was dropped into a mixed solvent of 6750 g of hexane and 2250 g of ethyl acetate and the resulting precipitate was repulped with 6500 g of hexane. The supernatant was removed, the residue was transferred to a centrifuge and the wet polymer was obtained by removing liquid. The obtained polymer was taken out and was dried under 20 mmHg (2.66 kPa) at 70° C. for 30 hours, and 105 g of the product polymer was obtained. The metal content in the product polymer was 70 ppb.

Example 12

A polymer solution was obtained by performing the polymerization in the same manner as in Example 11 except that a commercially available product of PGMEA was used as intact. The polymer solution was passed through a membrane filter having 0.5 μm of pore size and then 750 g of commercially available methyl isobutyl ketone (MIBK) was added. At that time, the metal content in the polymer solution was 1200 ppb.

Water washing procedure was performed by adding 1500 g of water (super-pure water) into the polymer solution, stirring and separating the solution. The metal content of the obtained organic layer was 250 ppb. The organic layer was passed through "IONCLEAN" (trade name) (produced by Nihon Pole Ltd. the quality of material: the super high molecular weight polyethylene of chemical modified type, the filtration area: 0.11 m²) constituted by a porous polyolefin membrane having a cation-exchange group at 100 g/min of flow rate at room temperature.

The obtained solution was dropped into a mixed solvent of 6750 g of hexane and 2250 g of ethyl acetate and the resulting precipitate was repulped with 6500 g of hexane. The supernatant was removed, the residue was transferred to a centrifuge and the wet polymer was obtained by removing liquid. The obtained polymer was taken out, was dried under 20 mmHg (2.66 kPa) at 70° C. for 30 hours and 105 g of the product polymer was obtained. The metal content in the product polymer was 60 ppb.

Comparative Example 5

A polymer solution was obtained by polymerizing in the same manner as in Example 11 except that a commercially available product of PGMEA was used as intact. The polymer solution was passed through a membrane filter having 0.5 μm of pore size and then 750 g of commercially available methyl isobutyl ketone (MIBK) was added. At that time, the metal content in the polymer solution was 1200 ppb.

Water washing step was performed by adding 1500 g of water (super-pure water) into the polymer solution, stirring and separating the solution. The metal content of the obtained organic layer was 250 ppb.

Without being passed through a porous polyolefin membrane, the organic layer was dropped into a mixed solvent of 6750 g of hexane and 2250 g of ethyl acetate and the resulting precipitate was repulped with 6500 g of hexane. The supernatant was removed, the residue was transferred to a centrifuge and the wet polymer was obtained by removing liquid. The obtained polymer was taken out, was dried under 20 mmHg (2.66 kPa) at 70° C. for 30 hours and 103 g of the product polymer was obtained. The metal content in the product polymer was 250 ppb.

Example 13

Production of photoresist polymeric compound with following structure

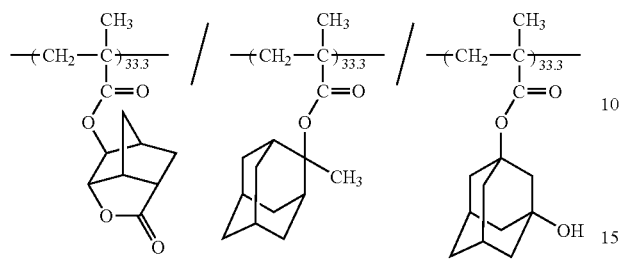

In a reactor equipped with a stirrer, a thermometer, a refluxing condenser, a dropping tube and a nitrogen gas introducing tube, 70 g of propylene glycol monomethyl ether acetate (PGMEA) was charged and after raising the temperature to 100° C., the mixed solution containing 50 g of 5-methacryloyloxy-2,6-norbornane carbolactone (MNBL) (metal content of 100 ppb or less), 50 g of 2-methacryloyloxy-2-methyladamantane (2-MMA), 50 g of 1-hydroxy-3-methacryloyloxyadamantane (HMA), 1.8 g of dimethyl-2,2'-azobis(2-methylpropionate) (initiator; "V-601" produced by Wako Pure Chemical Industries, Ltd.) and 530 g of PGMEA was added by dropping over 6 hours. After dropping, the resulting mixture was aged for 2 hours and the polymer solution containing 20% by weight of the polymeric compound represented by the above formula was obtained. The polymer solution was passed through a membrane filter having 0.5 μm of pore size and then 750 g of methyl isobutyl ketone (MIBK) was added. At that time, the metal content in the polymer solution was 1200 ppb.

Water washing procedure was performed by adding 1500 g of water (super-pure water) into the polymer solution, stirring and separating the solution. The metal content of the obtained organic layer was 250 ppb. The organic layer was passed through "IONCLEAN" (trade name) (produced by Nihon Pole Ltd. the quality of material: the super high molecular weight polyethylene of chemical modified type, the filtration area: 0.11 m$^2$) constituted by a porous polyolefin membrane having a cation-exchange group at 100 g/min of flow rate at room temperature.

The obtained solution was dropped into a mixed solvent of 6750 g of hexane and 2250 g of ethyl acetate and the resulting precipitate was repulped with 6500 g of hexane. The supernatant was removed, the residue was transferred to a centrifuge and the wet polymer was obtained by removing liquid. The obtained polymer was taken out, was dried under 20 mmHg (2.66 kPa) at 70° C. for 30 hours and 105 g of the product polymer was obtained. The metal content in the product polymer was 50 ppb.

Comparative Example 6

A polymer solution was obtained by performing the polymerization in the same manner as in Example 13. The polymer solution was passed through a membrane filter having 0.5 μm of pore size and then 750 g of commercially available methyl isobutyl ketone (MIBK) was added. At that time, the metal content in the polymer solution was 1200 ppb.

The polymer solution was passed through "IONCLEAN" (trade name) (produced by Nihon Pole Ltd. the quality of material: the super high molecular weight polyethylene of chemical modified type, the filtration area: 0.11 m$^2$) constituted by a porous polyolefin membrane having a cation-exchange group at 100 g/min of flow rate at room temperature.

The obtained solution was dropped into a mixed solvent of 6750 g of hexane and 2250 g of ethyl acetate and the resulting precipitate was repulped with 6500 g of hexane. The supernatant was removed, the residue was transferred to a centrifuge and the wet polymer was obtained by removing liquid. The obtained polymer was taken out, was dried under 20 mmHg (2.66 kPa) at 70° C. for 30 hours and 108 g of the product polymer was obtained. The metal content in the product polymer was 70 ppb.

Example 14

Production of photoresist polymeric compound with following structure

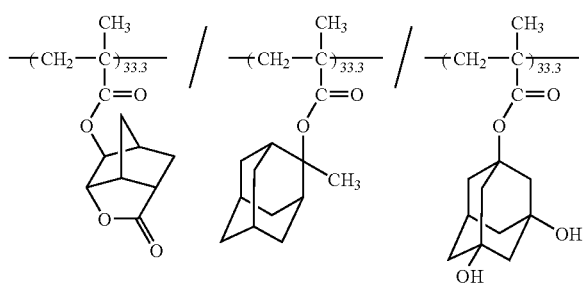

In a reactor equipped with a stirrer, a thermometer, a refluxing condenser, a dropping tube and a nitrogen gas introducing tube, 70 g of propylene glycol monomethyl ether acetate (PGMEA) was charged and after raising the temperature to 100° C., the mixed solution containing 50 g of 5-methacryloyloxy-2,6-norbornane carbolactone (MNBL), 50 g of 2-methacryloyloxy-2-methyladamantane (2-MMA), 50 g of 1,3-dihydroxy-5-methacryloyloxyadamantane (DHMA), 1.8 g of dimethyl-2,2'-azobis(2-methylpropionate) (initiator; "V-601" produced by Wako Pure Chemical Industries, Ltd.) and 530 g of PGMEA was added by dropping over 6 hours. After dropping, the resulting mixture was aged for 2 hours and the polymer solution containing 20% by weight of the polymeric compound represented by the above formula. The polymer solution was passed through a membrane filter having 0.5 μm of pore size and then 750 g of methyl isobutyl ketone (MIBK) was added. At that time, the metal content in the polymer solution was 1200 ppb.

Water washing procedure was performed by adding 1500 g of water (super-pure water) into the polymer solution, stirring and separating the solution. The metal content of the obtained organic layer was 250 ppb. The organic layer was passed through "IONCLEAN" (trade name) (produced by Nihon Pole Ltd. the quality of material: the super high molecular weight polyethylene of chemical modified type, the filtration area: 0.11 m$^2$) constituted by a porous polyolefin membrane having a cation-exchange group at 100 g/min of flow rate at room temperature.

The obtained solution was dropped into a mixed solvent of 6750 g of hexane and 2250 g of ethyl acetate and the resulting precipitate was repulped with 6500 g of hexane. The supernatant was removed, the residue was transferred to a centrifuge and the wet polymer was obtained by removing liquid. The obtained polymer was taken out, was dried under 20 mmHg (2.66 kPa) at 70° C. for 30 hours and 105 g of the product polymer was obtained. The metal content in the product polymer was 50 ppb.

Example 15

Production of photoresist polymeric compound with following structure

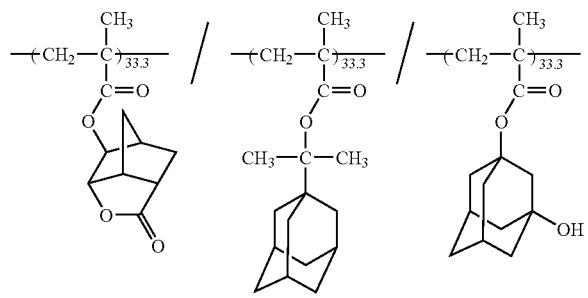

In a reactor equipped with a stirrer, a thermometer, a refluxing condenser, a dropping tube and a nitrogen gas introducing tube, 70 g of propylene glycol monomethyl ether acetate (PGMEA) was charged and after raising the temperature to 100° C., the mixed solution containing 50 g of 5-methacryloyloxy-2,6-norbornane carbolactone (MNBL) (metal content of 100 ppb or less), 50 g of 1-(1-methacryloyloxy-1-methylethyl)adamantane (IAM), 50 g of 1-hydroxy-3-methacryloyloxyadamantane (HMA), 1.8 g of dimethyl-2,2'-azobis(2-methylpropionate) (initiator; "V-601" produced by Wako Pure Chemical Industries, Ltd.) and 530 g of PGMEA was added by dropping over 6 hours. After dropping, the resulting mixture was aged for 2 hours and the polymer solution containing 20% by weight of the polymeric compound represented by the above formula. The polymer solution was passed through a membrane filter having 0.5 μm of pore size and then 750 g of methyl isobutyl ketone (MIBK) was added. At that time, the metal content in the polymer solution was 1200 ppb.

Water washing procedure was performed by adding 1500 g of water (super-pure water) into the polymer solution, stirring and separating the solution. The metal content of the obtained organic layer was 250 ppb. The organic layer was passed through "IONCLEAN" (trade name) (produced by Nihon Pole Ltd. the quality of material: the super high molecular weight polyethylene of chemical modified type, the filtration area: 0.11 m²) constituted by a porous polyolefin membrane having a cation-exchange group at 100 g/min of flow rate at room temperature.

The obtained solution was dropped into a mixed solvent of 6750 g of hexane and 2250 g of ethyl acetate and the resulting precipitate was repulped with 6500 g of hexane. The supernatant was removed, the residue was transferred to a centrifuge and the wet polymer was obtained by removing liquid. The obtained polymer was taken out, was dried under 20 mmHg (2.66 kPa) at 70° C. for 30 hours and 105 g of the product polymer was obtained. The metal content in the product polymer was 50 ppb.

Evaluating Test

By dissolving 100 parts by weight of each of the polymers obtained in the Example 11 to 15 and Comparative Examples 4 to 6 and 10 parts by weight of triphenylsulfoniumhexafluoroantimonate in ethyl lactate, a photoresist resin composition with 20% by weight of polymer concentration was prepared.

The photoresist resin composition was spread on a silicon wafer by the spin-coating method and a photosensitive layer with 1.0 μm thin was formed. After pre-baking on a hot plate at 110° C. for 120 seconds, light-exposing was performed through a mask at 30 mJ/cm² irradiation by using 247 nm wave-length of KrF excimer laser, and then the substrate was post-baked at 120° C. for 60 seconds. Subsequently, the substrate was developed in 0.3 M tetramethylammoniumhydroxide aqueous solution for 60 seconds and was rinsed with pure water.

As a result, in case of using the polymers of Examples 11 to 15, a pattern with 0.30 μm line and space was yielded. On the other hand, when using the polymers of Comparative Examples 4 to 6, only lost pattern was yielded by an influence of hydrogen ion (acid) generated at the passing through "IONCLEAN". Further, in the case of using the polymer of Comparative Example 5, a pattern of line and space equivalent to the Example was yielded, but an electrical characteristic was wrong because of large content of metal.

What is claimed is:

1. A process for producing an ArF excimer-laser photoresist polymer solution containing a polymer having:
    a repeated unit corresponding to at least one monomer selected from a monomer (a) having a lactone skeleton and a monomer (c) having an alicyclic skeleton having a hydroxyl group; and
    another repeated unit corresponding to a monomer (b) having a group which becomes soluble in alkali by elimination with an acid, the process comprising:
    (i) a polymerization step (A) of subjecting a mixture of monomers containing at least one monomer selected from the above monomers (a) and (c) and containing the monomer (b) to polymerization by a dropping polymerization method to obtain a polymer solution R;
    (ii) a precipitation purification step (C) of precipitating and purificating the polymer formed in the step (A) by separating the polymer from the polymer solution R to obtain a wet polymer;
    (iii) a redissolving step (G) of redissolving the wet polymer separated and purified by the step (C) in an organic solvent to obtain a polymer solution S; and
    (iv) an evaporating step (H) of evaporating the organic solvent in the polymer solution S,
    wherein, by the evaporating step (H), a low-boiling-point solvent contained in the polymer solution S obtained by the redissolving step (G) is removed, and the polymer solution S is concentrated to prepare the photoresist polymer solution.

2. The process for producing the ArF excimer-laser photoresist polymer solution of claim 1, further comprising at least one of a extraction step, a repulping step and a rinsing step before the evaporating step (H),
    wherein the low-boiling-point solvent contained in the polymer solution S is at least one of solvents used as a polymerization solvent, an extraction solvent, an precipitating solvent, an repulping solvent and a rinse solvent.

3. The process for producing the ArF excimer-laser photoresist polymer solution of claim 1, wherein the concentration of the polymer solution S is performed under a reduced pressure.

4. The process for producing the ArF excimer-laser photoresist polymer solution of claim 1, wherein the monomer (a) having the lactone skeleton is a (meth) acrylic acid ester monomer represented by the following formula (1a), (1b) or (1c):

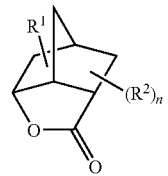
(1a)

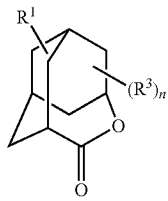
(1b)

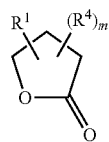
(1c)

wherein $R^1$ is a group including (meth)acryloyloxy group, each of $R^2$, $R^3$ and $R^4$ is a lower alkyl group, n denotes an integer of 0 to 3, and m denotes an integer of 0 to 5.

5. The process for producing the ArF excimer-laser photoresist polymer solution of claim 1, wherein the monomer (b) having the group which becomes soluble in alkali by elimination with the acid is a (meth)acrylic acid ester monomer represented by the following formula (2a) or (2b):

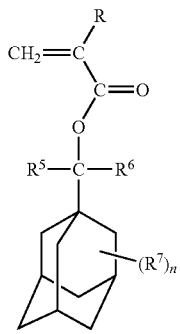
(2a)

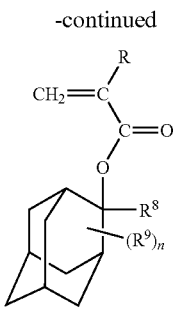
(2b)

wherein R is a hydrogen atom or a methyl group, $R^5$ is a hydrogen atom or a lower alkyl group, each of $R^6$, $R^7$, $R^8$ and $R^9$ is a lower alkyl group, and n denotes an integer of 0 to 3.

6. The process for producing the ArF excimer-laser photoresist polymer solution of claim 1, wherein the monomer (c) having the alicyclic skeleton having the hydroxyl group is a (meth)acrylic acid ester monomer represented by the following formula (3a):

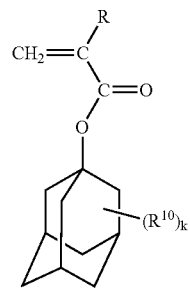
(3a)

wherein R is a hydrogen atom or a methyl group, $R^{10}$ is a methyl group, a hydroxyl group, an oxo group or a carboxyl group and k denotes an integer of 1 to 3, wherein at least one of the k $R^{10}$s is a hydroxyl group.

7. The process for producing the ArF excimer-laser photoresist polymer solution of claim 1, wherein the polymer solution S is applied to the photoresist polymer solution of a concentration of the polymer of 10 to 40% by weight.

8. The process for producing the ArF excimer-laser photoresist polymer solution of claim 1, wherein the organic solvent used to redissolve the wet polymer is one selected from a group consisting of glycols solvent, esters solvent, ketones solvent, and a mixed solvent thereof.

\* \* \* \* \*